United States Patent [19]
Ikeda

[11] Patent Number: 5,963,423
[45] Date of Patent: Oct. 5, 1999

[54] SURFACE MOUNTABLE ELECTRONIC DEVICES

[75] Inventor: Yutaka Ikeda, Shiga, Japan

[73] Assignee: Murata Manufacturing Co., Ltd., Kyoto, Japan

[21] Appl. No.: 09/074,507

[22] Filed: May 7, 1998

[30] Foreign Application Priority Data

May 23, 1997 [JP] Japan ................................. 9-133584

[51] Int. Cl.$^6$ ................................................. H05K 7/20
[52] U.S. Cl. ..................... 361/690; 338/22 R; 361/704; 361/714
[58] Field of Search .................................. 361/690, 704, 361/707, 710, 714, 715, 719, 720, 728, 730, 733, 760, 807–812

[56] References Cited

U.S. PATENT DOCUMENTS

| | | | |
|---|---|---|---|
| 4,939,498 | 7/1990 | Yamada et al. | 338/22 R |
| 5,142,265 | 8/1992 | Matoyoshi | 338/22 R |
| 5,233,326 | 8/1993 | Matoyoshi | 338/22 R |
| 5,760,336 | 6/1998 | Wang | 174/52.1 |
| 5,760,676 | 6/1998 | Yamada | 338/234 |

FOREIGN PATENT DOCUMENTS 8-017603  1/1996  Japan.

*Primary Examiner*—Gregory Thompson
*Attorney, Agent, or Firm*—Majestic, Parsons, Seibert & Hsue P.C.

[57] ABSTRACT

A surface mountable electronic device has a case with an opening, an electronic element contained inside the case such as a thermistor or a varistor that generates heats when in operation, a plurality of elongated spring terminals supporting this electronic element elastically together and each sandwiching a wall of the case both from inside and outside at a peripheral edge part of the wall at its opening, and a lid attached to the case so as to close up its opening except where the spring terminals pass through the opening. Grooves are preferably formed at peripheral edge parts of the wall where the spring terminals are fitted, contacting the wall such that heat generated by the electronic element during its operation and propagating through the spring terminals can be effectively conducted to the main body of the case and diverted from its soldered junctures with a circuit board.

9 Claims, 5 Drawing Sheets

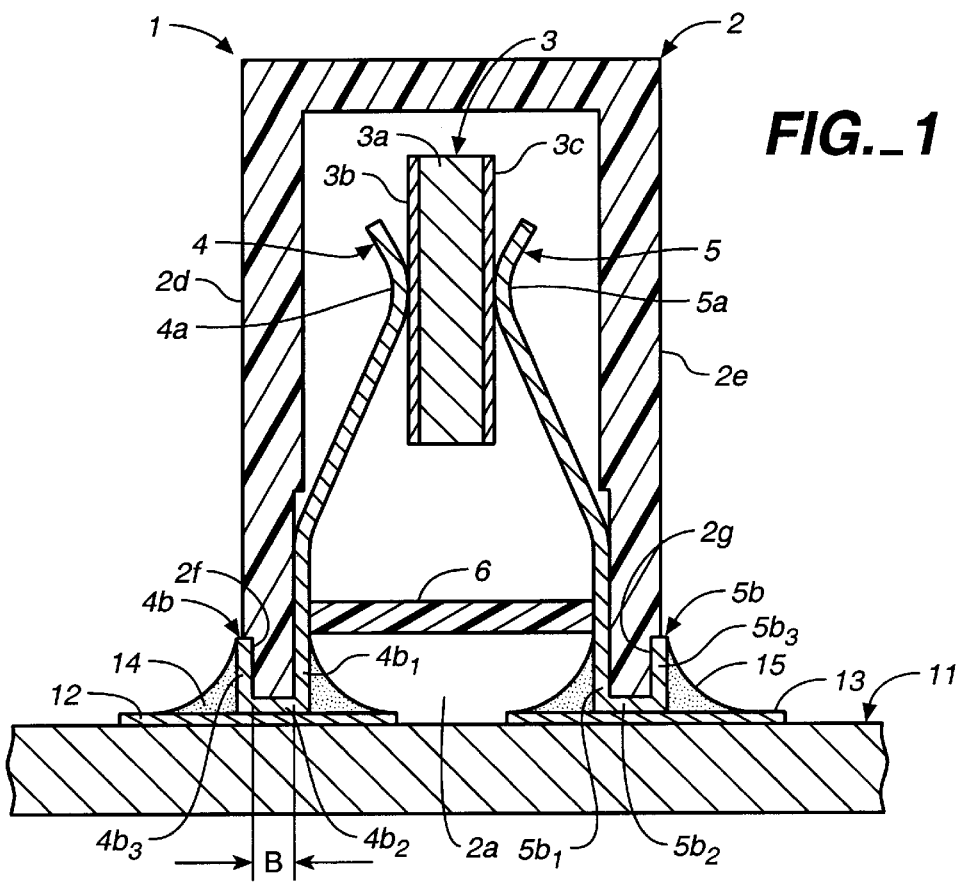
FIG._1
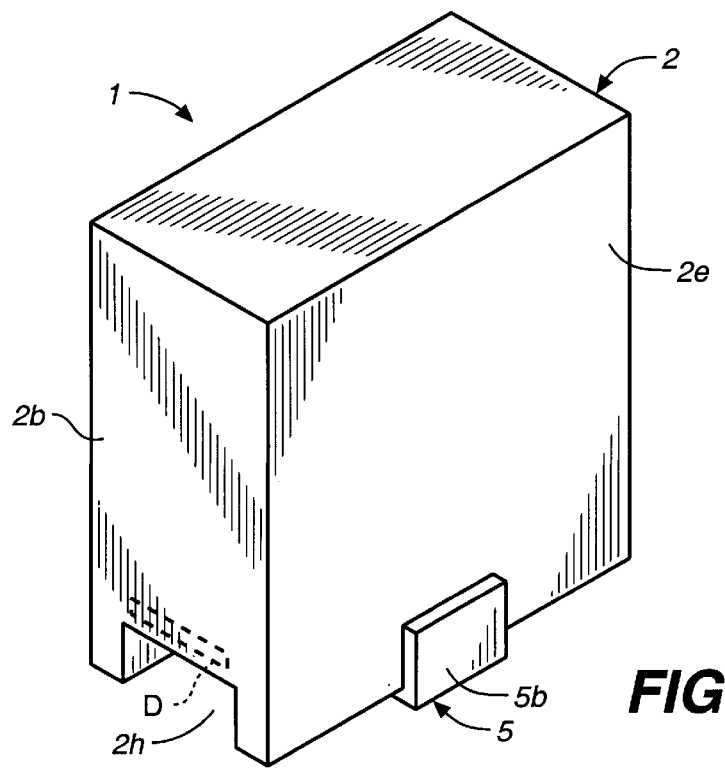
FIG._2

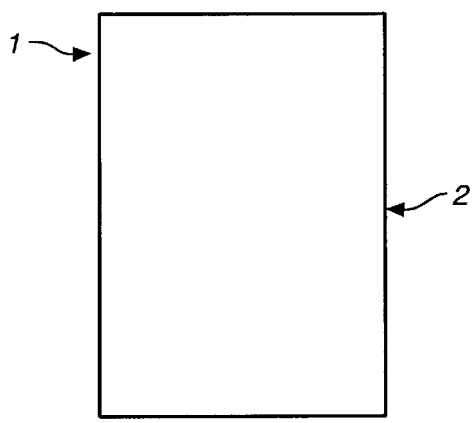
FIG._3A
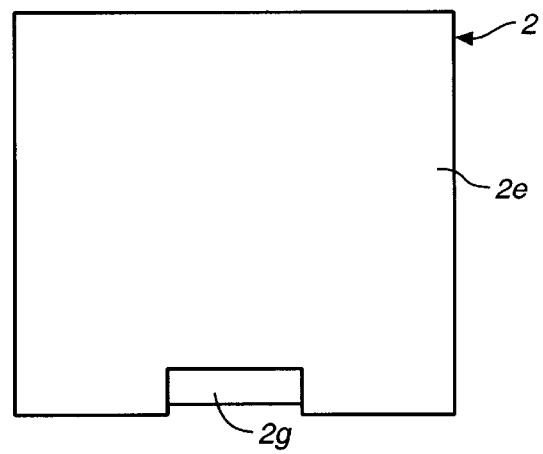
FIG._4A
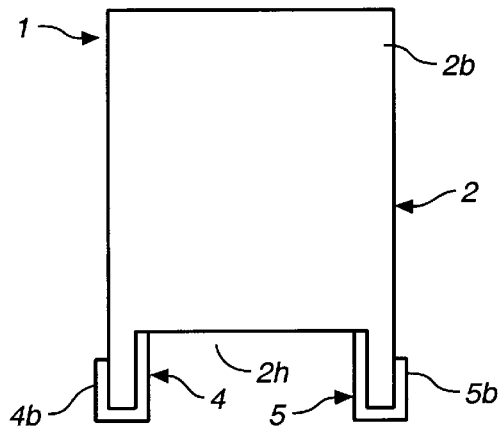
FIG._3B
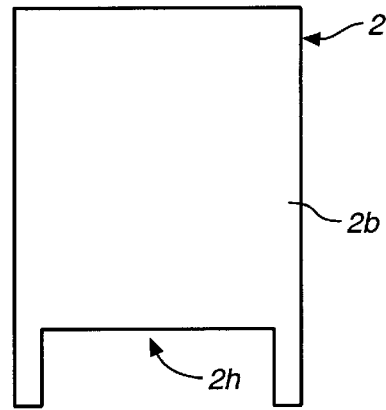
FIG._4B
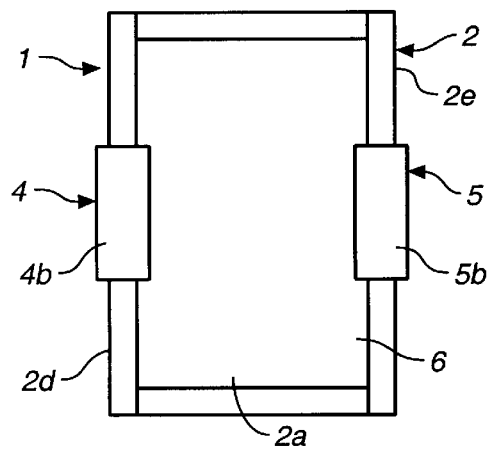
FIG._3C
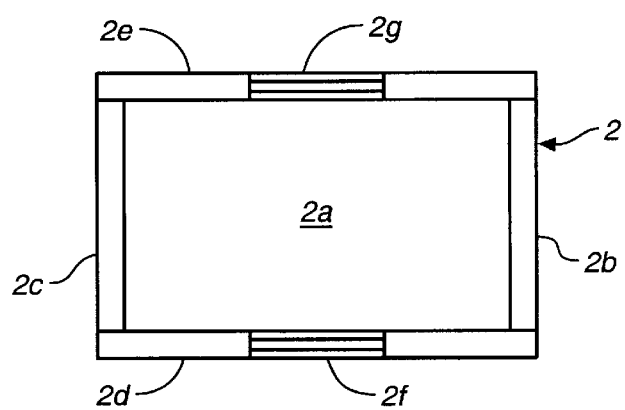
FIG._4C

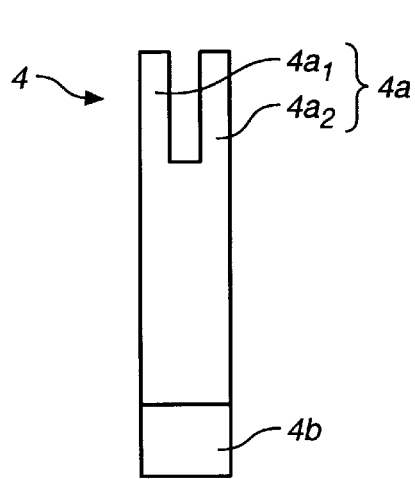
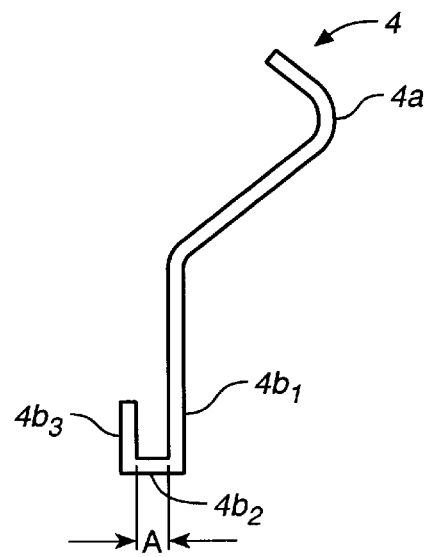
FIG._5A  FIG._5B
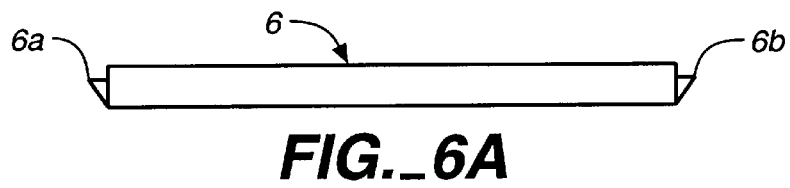
FIG._6A
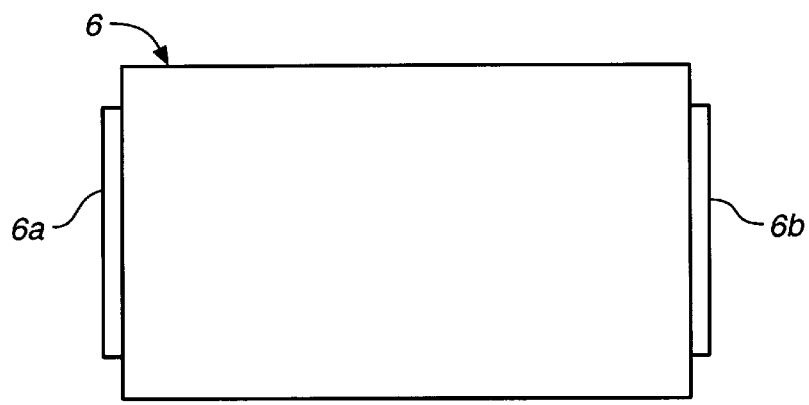
FIG._6B

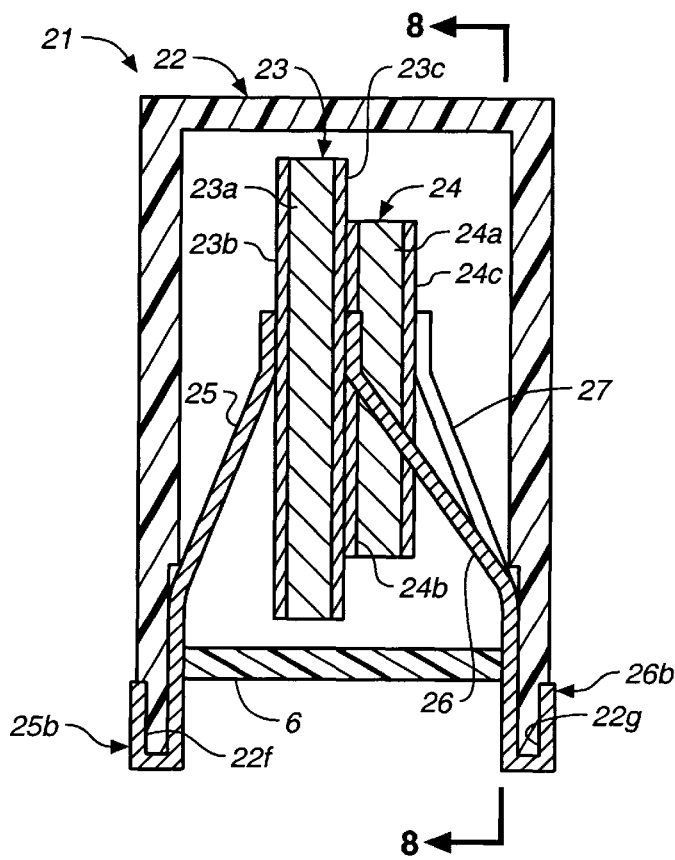
FIG._7
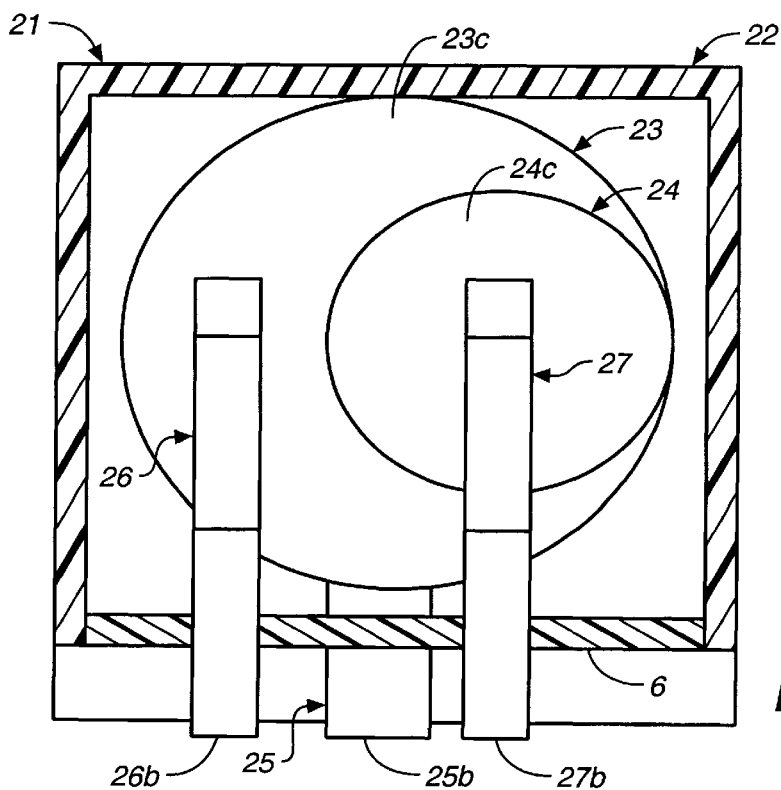
FIG._8

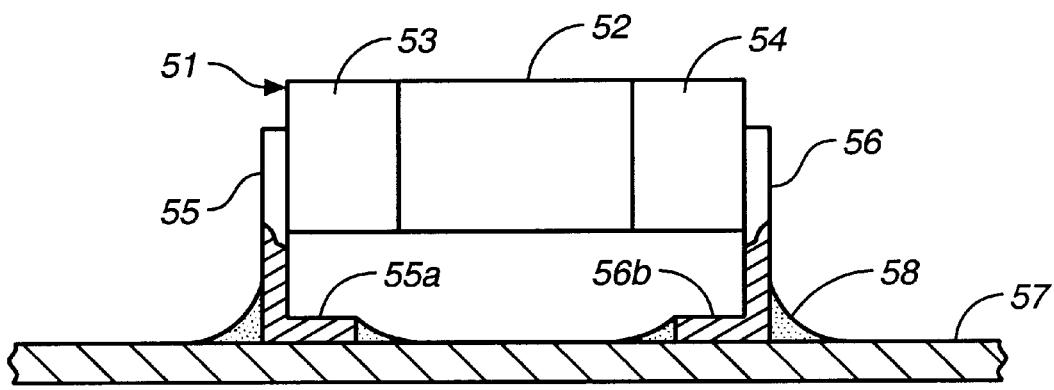
FIG._9
(PRIOR ART)
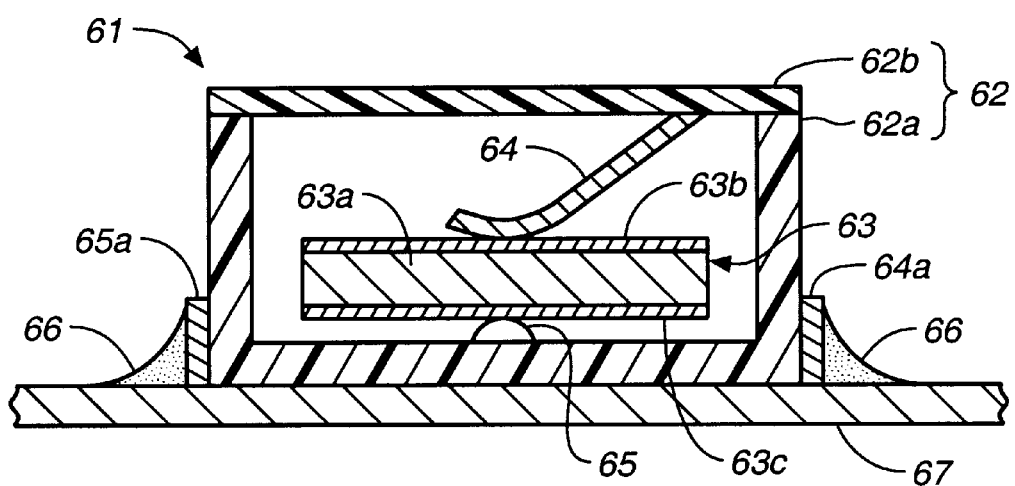
FIG._10
(PRIOR ART)

SURFACE MOUNTABLE ELECTRONIC DEVICES

BACKGROUND OF THE INVENTION

This invention relates to surface mountable electronic devices which support an electronic element elastically within a case by sandwiching it between spring terminals. More in particular, this invention relates to such electronic devices suitable for containing a heat-emitting electronic element such as a thermistor or a varistor.

Surface mountable electronic devices are coming to be used widely as high-density electronic apparatus are being developed. Surface mountable electronic devices are usually formed by placing an electronic element on a connector such as an electrode land on a printed circuit board and connecting the electrodes of the electronic element electrically, for example by soldering, on the connector land.

FIG. 9 shows an example of such a surface mountable electronic device 51 disclosed in Japanese Patent Publication Tokkai 8-17603, having electrode caps 53 and 54 formed on both ends of a cylindrically shaped electronic element 52. The electrode caps 53 and 54 are attached to terminals 55 and 56 having end parts 55a and 56b bent parallel to the longitudinal direction of the element 52. When this is surface-mounted, these bent end parts 55a and 56b are placed on a printed circuit board 57 and a solder material 58 is applied. Although the electronic element 52 is cylindrically shaped and hence may tend to rotate easily, the terminals 55 and 56 serve to prevent such a rotary motion when the device 51 is surface-mounted by means of an ordinary mounting equipment.

FIG. 10 shows another example of a prior art surface mountable electronic device 61, having an electronic element 63 contained inside a case 62 of a synthetic resin material. The case 62 has a main body 62a with an opening at the top and a lid 62b serving to close up this opening. The element 63 has electrodes 63b and 63c formed on both surfaces of a disk-shaped main body 63b. A spring terminal 64 contacts the electrode 63a while the other electrode 63c is electrically connected to a terminal having a protrusion 65. The spring terminal 64 has an opposite end 64a pulled out of the case 62. The terminal having the protrusion 65 also has an opposite end part 65a pulled out of the case 62. These pulled-out end parts 64a and 65a are both soldered (indicated by numerals 66) to a printed circuit board 67. Such a device is considered useful for containing a heat-generating electronic element such as a thermistor or a varistor because the case 62 made of a resin material, the spring terminal 64 and the protrusion 65 serve to impede the propagation of generated heat to the solder material 66 at the junction with the circuit board 67.

As is well known, some electronic elements such as varistors and thermistors generate heat when in use and may reach a very high temperature while being mounted. In the case of the mounting shown in FIG. 9, it may be considered that the propagation of heat from the element 52 to the solder material 58 is impeded by the length of the terminals 55 and 56 but this is frequently not sufficient to prevent the deterioration of the circuit board 57 by heat if the element 52 becomes very hot. Even with a structure as shown in FIG. 10, the separation between the element 63 and the printed circuit board 67 is relatively small. If the temperature of element 63 exceeds 100° C., for example, the junctures by the solder material 66 become fragile and/or the printed circuit board 67 starts to show burnt marks.

SUMMARY OF THE INVENTION

It is therefore an object of this invention to provide surface mountable electronic devices with which adverse effects of heat generated by an electronic element contained therein can be further reduced.

A surface mountable electronic device embodying this invention, with which the above and other objects can be accomplished, may be characterized as comprising a case with an opening, an electronic element contained inside the case such as a thermistor or a varistor that generates heat when in operation, a plurality of elongated spring terminals supporting this electronic element elastically together and each sandwiching a wall of the case both from inside and outside at a peripheral edge part of the wall at its opening, and a lid attached to the case so as to close up its opening except where the spring terminals pass through the opening. Grooves are preferably formed at peripheral edge parts of the wall where the spring terminals are fitted, contacting the wall.

With an electronic device thus structured, the heat generated by the electronic element in operation and propagating through the plurality of spring terminals are effectively conducted to the case because each of these spring terminals sandwiches a peripheral edge part of the case contacting it over an extended length from both inside and outside. Thus, when the device is mounted to a printed circuit board by soldering, the heat from the electronic element does not deteriorate the soldered junctures or the circuit board, and it can serve as a reliable electronic device. Unlike the prior art devices for which spring terminals had to be formed together with the case by an insert molding process, no particular mold is required according to this invention for assembly. The spring terminals according to this invention are simply attached to the wall and hence do not require any mold and can be formed and assembled easily. Thus, the production cost can be reduced according to this invention. With grooves formed on the walls as described above, the spring terminals can be accurately and easily positioned correctly.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a vertically sectional view of a surface mountable electronic device embodying this invention surface-mounted to a printed circuit board;

FIG. 2 is a diagonal view of the electronic device of FIG. 1;

FIGS. 3A, 3B and 3C are respectively a plan view, a side view and a bottom view of the electronic device of FIG. 1;

FIGS. 4A, 4B and 4C are respectively a front view, a side view and a bottom view of the case for the electronic device of FIG. 1;

FIGS. 5A and 5B are respectively a front view and a side view of the spring terminal of the electronic device of FIG. 1;

FIGS. 6A and 6B are respectively a front view and a plan view of the lid for the case of FIGS. 4A, 4B and 4C;

FIG. 7 is sectional view of another surface-mountable electronic device embodying this invention;

FIG. 8 is a sectional view taken along line 8—8 of FIG. 7;

FIG. 9 is a sectional view of a prior art surface mountable electronic device with parts removed; and FIG. 10 is a vertically sectional view of another prior art surface mountable electronic device.

Like components may be indicated by the same numerals and may not be repetitiously described.

DETAILED DESCRIPTION OF THE INVENTION

The invention is described next by way of an example with reference to FIGS. 1, 2, 3A, 3B and 3C which show a surface mountable electronic device 1 with a case 2 containing therein a PTC thermistor 3 (having a positive temperature coefficient) as an example of an electronic element. The electronic element to be contained inside the case 2 may be of any other kind such as a NTC thermistor (having a negative temperature coefficient) or a varistor. This invention is particularly useful when the enclosed electronic element is of such a kind that generates heat.

The case 2 is of a synthetic resin material and is approximately of the shape of an rectangular parallelopiped, having an opening 2a at the bottom. The invention does not impose any particular limitation on the kind of the synthetic resin. An appropriate kind of synthetic resin such as phenol resin, polyphenylene sulfide resin and polybutylene terephthalate may be used. Alternatively, the case 2 may be formed with a ceramic material such as alumina.

As more clearly shown in FIGS. 4A, 4B and 4C, the case 2 is so formed that the bottom ends of a pair of its mutually opposite side walls 2b and 2c terminate at a higher position that the bottom ends of the other pair of mutually opposite side walls 2d and 2e. Thus, when seen from the direction of the side wall 2b, the case 2 may seem to have an empty space 2h underneath, as shown in FIG. 4B.

Grooves 2f and 2g are formed, as shown in FIGS. 4A and 4C, at the center bottom edge parts and extending on both the inside and outside surfaces of the pair of side walls 2d and 2e such that the thickness of these two side walls 2d and 2e is somewhat reduced where these grooves 2f and 2g are formed. The purpose of these grooves 2f and 2g is to make it easier to position spring terminal 4 and 5 (to be described more in detail below) when they are attached. For this reason, the width (or the horizontal extension) of the grooves 2f and 2g is set nearly equal to but somewhat larger than the width of these spring terminals 4 and 5. As shown more clearly in FIG. 1, these grooves 2f and 2g are so extended that the parts on the inner surfaces of the case 2 reach farther upward than those on the outer surfaces.

With reference to FIG. 1 again, the PTC thermistor 3 has electrodes 3b and 3c formed on both of its mutually opposite principal surfaces of its planar main body 3a made of a semiconductor ceramic material such as barium titanate ceramics and is supported elastically by and between the aforementioned spring terminals 4 and 5, one of these spring terminals (4) being in contact with one of the surface electrodes (3b) and the other of the spring terminals (5) contacting the other of the surface electrodes (3c).

The spring terminals 4 and 5 are elongated members and each have an elastic contact part 4a or 5a at one end part for making an elastic contact with corresponding one of the electrodes 3b and 3c. Since they are structured similarly, FIGS. 5A and 5B will be referenced next to describe the structure of only one of them (4).

The contact part 4a is formed by bending an elongated planar metal member into an arcuate shape and has a pair of branches $4a_1$ and $4a_2$. At the opposite end away from the contact part 4a, the metallic material of the spring terminal 4 is bent into a U-shape to form a sandwiching part 4b for being attached to the peripheral edge around the bottom opening of the case 2 as shown in FIG. 1. Since the purpose of this sandwiching part 4b is to sandwich the side wall 2d and to be thus supported thereby, the inner width A of the U-shaped portion indicated in FIG. 5B is approximately equal to the thickness B of the side walls 2d and 2e at their bottom edge as indicated in FIG. 1. Explained more in detail with reference to FIG. 5B, the width A is the distance between the left-hand side surface of the base portion $4b_1$ of the sandwiching part 4b and the right-hand side surface of the tip portion $4b_3$ which is bent from the bottom portion $4b_2$ parallel to the base portion $4b_1$. The thickness B is the thickness of the side walls 2d where the grooves 2f are formed on both its inner and outer surfaces.

The spring terminals 4 and 5 may preferably be obtained by a press-molding method with any appropriate metallic material with an adequate spring-like quality such as stainless steel, phosphor bronze, German silver and copper-titanium alloys.

In order to improve solderability of the sandwiching parts 4b and 5b of the spring terminals 4 and 5 at the time of surface-mounting, the device 1 may preferably be plated with a solderable material such as Sn, Pb and their alloys. These sandwiching parts 4b and 5b are attached to the case 2 so as to fit into the grooves 2f and 2g, sandwiching the side walls 2d and 2e of the case 2 at the peripheral edge parts of its opening 2a. Thus, the tip portions $4b_3$ and $5b_3$ of the sandwiching parts 4b and 5b of the spring terminals 4 and 5 are exposed on the outer surface of the case 2, as shown in FIG. 1.

The opening 2a of the case 2 is closed up by a lid 6 except where the spring terminals 4 and 5 are extending to the exterior. As shown in FIGS. 6A and 6B, the lid 6 is approximately rectangularly shaped and may comprise an electrically insulating material, like the case 2, such as synthetic resin and alumina. Engaging parts 6a and 6b are provided along its mutually opposite edges so as to fit engagingly with indentations formed on the inner surfaces of the side walls 2b and 2c of the case 2. Broken line D in FIG. 2 indicates the position where the indentation may be formed on the inner wall.

Although the invention has been described above by way of only one example, this is not intended to limit the scope of the invention. Many modifications and variations are possible within the scope of this invention. For example, the space 2h need not be intentionally provided. The bottom edges of the pair of side walls 2b and 2c and those of the other pair of side walls 2d and 2e may be on the same surface. As another example, the planar shape of the PTC thermistor 3 need not be circular. It may be rectangular or of any other shape.

With reference again to FIG. 1, the surface mountable electronic device 1 according to this invention may be characterized as having the spring terminals 4 and 5 having sandwiching parts 4b and 5b formed so as to sandwich peripheral edge parts of side walls of the case 2 around its bottom opening 2a. As shown in FIG. 1, the device 1 placed on the printed circuit board 11 such that these sandwiching parts 4b and 5b are in contact therewith and a solder material is deposited at 14 and 15 on connecting lands 12 and 13 on the circuit board 11 for the attachment. Since the sandwiching parts 4b and 5b are formed not only on the bottom edge surfaces of the side walls 2d and 2e but also so as to cover bottom parts of their inner and outer surfaces, the solder material at 14 and 15 can be dependably attached to the connecting lands 12 and 13 over large contacting areas.

Since these sandwiching parts 4b and 5b of the spring terminals 4 and 5 contact the side walls 2d and 2e of the case 2 over the length of the grooves 2f and 2g, the heat which propagates through the spring terminals 4 and 5, when the PTC thermistor 3 is in a very high-temperature condition, can be conducted effectively through the case 2, controlling the further propagation of the heat towards the junctures with the solder material at 14 and 15 and thereby preventing deterioration of the connecting parts and burning of the printed circuit board 11.

Still another advantage of the device 1 is that its structure is simple and hence can be assembled easily by inserting the spring terminals 4 and 5 onto the case 2 as described above. In other words, no complicated production process such as insert molding is required.

As for the dimensions of the grooves 2f and 2g, their depths measured from the bottom edge surfaces of the side walls 2d and 2e should preferably be about the same or somewhat less than the thickness of the spring terminals 4 and 5 such that their sandwiching parts 4b and 5b can be easily connected by soldering. If otherwise, the lower surfaces of the spring terminals 4 and 5 become higher than the peripheral edge parts of the opening 2a, and this may affect the solderability adversely.

Another surface mountable electronic device 21 according to a second embodiment of this invention is described next with reference to FIGS. 7 and 8. This device 21 may be characterized as having a plurality (two, in this example) of PTC thermistors 23 and 24 enclosed inside a case 22. One of the thermistors (23) has electrodes 23b and 23c formed on the principal surfaces of a thermistor main body 23a, and the other thermistor 24 has electrodes 24b and 24c formed on the principal surfaces of its main body 24a having a smaller diameter than the thermistor main body 23a. These two thermistors 23 and 24 are disposed such that one of the electrodes (23c) of the larger thermistor 23 and one of the electrodes (24b) of the smaller thermistor 24 are contacting each other in a face-to-face relationship. A spring terminal 25 elastically contacts the electrode 23b of the larger thermistor 23, another spring terminal 26 elastically contacts the other electrode 23c of the larger thermistor 23, and still another spring terminal 27 elastically contacts the electrode 24c of the smaller thermistor 24. As can be seen in FIG. 8, the spring terminal 25 contacts the electrode 23b nearly at the center of one of the principal surfaces of the larger thermistor 23, but the spring terminals 26 and 27 contact the electrodes 23c and 24c on the thermistors 23 and 24 respectively on both sides of the spring terminal 25. In summary, the two thermistors 23 and 24 are elastically supported by the three spring terminals 25, 26 and 27 inside the case 22.

The individual spring terminals 25, 26 and 27 of FIGS. 7 and 8 may be formed similarly as the spring terminals 4 and 5 shown in FIG. 1, having sandwiching parts 25b, 26b and 27b adapted to fit inside grooves 22f and 22g formed on both inner and outer surfaces of the bottom edge parts of the case 22. Thus, even when both or either of the thermistors 23 and 24 has reached a very high temperature, the heat emitted thereby and conducted through the spring terminals 25–27 can be effectively propagated to the case 22 such that the unwanted effects of the heat on the junctures between the spring terminals 25–27 and a printed circuit board or on the circuit board itself can be restrained.

The grooves 2f, 2g, 22f and 22g are convenient for the positioning of the spring terminals 4, 5, 24, 25 and 27 but they are not essential. The lid 6 may be attached to the case 2 or 22 by an adhesive or any other such means as long as the bottom opening of the case 2 or 22 can be closed except where the spring terminals can extend downward from the interior of the case 2 or 22.

FIGS. 7 and 8 are not intended to limit the scope of the second embodiment of the invention. The number of electronic elements to be contained inside the case is not limited to be two but may be three or greater.

What is claimed is:

1. A surface mountable electronic device comprising:

a case having an opening;

an electronic element contained inside said case;

a plurality of spring terminals supporting said electronic element elastically together and each sandwiching a respective wall of said case both from inside and outside at a peripheral edge part of said respective wall at said opening; and a lid attached to said case so as to close up said opening except where said spring terminals pass through said opening.

2. The device of claim 1 wherein grooves are formed on said wall at said peripheral edge part, a corresponding one of said spring terminals contacting said wall and fitting in said grooves.

3. The device of claim 1 wherein said electronic element generates heat when in operation, said heat being conducted through said case.

4. The device of claim 2 wherein said electronic element generates heat when in operation, said heat being conducted through said case.

5. The device of claim 1 wherein each of said spring terminals is elongated, has an arcuate elastic contacting part at one end portion thereof which contacts and supports said electronic element, and is bent twice at right angles at the other end portion thereof.

6. The device of claim 2 wherein each of said spring terminals is elongated, has an arcuate elastic contacting part at one end portion thereof which contacts and supports said electronic element, and is bent twice at right angles at the other end portion thereof.

7. The device of claim 1 wherein said case contains therein a plurality of electronic elements, each of said plurality of electronic elements being supported at least from one side by one of said spring terminals.

8. The device of claim 7 wherein said plurality of electronic elements are pressed against each other by said spring terminals.

9. The device of claim 8 wherein said plurality of electronic elements are both planar and have different surface areas.

* * * * *